United States Patent [19]

Tai

[11] Patent Number: 5,764,582

[45] Date of Patent: Jun. 9, 1998

[54] APPARATUS AND METHOD OF REFRESHING A DYNAMIC RANDOM ACCESS MEMORY

[75] Inventor: Jy-Der David Tai, Hsinchu, Taiwan

[73] Assignee: Powerchip Semiconductor Corp., Hsinchu, Taiwan

[21] Appl. No.: 756,794

[22] Filed: Nov. 26, 1996

[51] Int. Cl.[6] ................................................. G11C 7/00
[52] U.S. Cl. ................................................. 365/222; 365/149
[58] Field of Search ........................................ 365/222, 149

[56] References Cited

U.S. PATENT DOCUMENTS

| 4,755,964 | 7/1988 | Miner | 365/233 |
|---|---|---|---|
| 5,347,480 | 9/1994 | Urai | 365/222 |
| 5,424,980 | 6/1995 | Vinal | 365/205 |
| 5,430,680 | 7/1995 | Parris | 365/222 |
| 5,471,430 | 11/1995 | Sawada et al. | 365/222 |

*Primary Examiner*—David C. Nelms
*Assistant Examiner*—Michael T. Tran
*Attorney, Agent, or Firm*—Ladas & Parry

[57] ABSTRACT

A method and apparatus employing a power-saving technique to refresh data stored in an array of memory cells is disclosed. The refresh apparatus includes a latch circuit, where a reset signal is used to reset the latch circuit, and an input signal is provided change the state of the latch circuit. The refresh system also includes a circuit for generating a select signal electrically connected to the input of the latch circuit. The refresh further includes a pass circuit for passing a decoded signal to generate a selective refresh signal when the latch circuit is set, thereby refreshing one row of the memory cells which contains valid data (i.e., only after a write operation has occurred on the row in question).

10 Claims, 3 Drawing Sheets

5,764,582

APPARATUS AND METHOD OF REFRESHING A DYNAMIC RANDOM ACCESS MEMORY

BACKGROUND OF THE INVENTION

1. Field of the Invention

The present invention relates to a method and apparatus of refreshing a dynamic random access memory, and particularly to a method and apparatus of selecting and refreshing an array of memory cells, which is arranged in subsets of the memory cells.

2. Description of the Prior Art

Data utilized in an electronic system is often stored in many tiny capacitors, commonly referred to as memory cells, of a memory device such as a dynamic random access memory (DRAM). As is true for most electronic devices, the electrical charge in the memory cell leaks away over a period of time due to leakage which occurs in access transistors coupled to the memory cells, which leakage can change the electrical charge originally stored to an incorrect voltage level or state. The memory cell may also be disturbed through access transistor by other noise source such as wordline coupling. A data refreshing scheme is therefore utilized to restore or refresh periodically the electrical charge stored in the memory cell capacitor.

A predefined time is conventionally used to refresh timely all memory cells in order to overcome this leakage effect. For example, a few milliseconds are usually needed to refresh a dynamic random access memory (DRAM). However, as electrical power is consumed in each refresh cycle, a portion of the electrical power is wasted refreshing those memory cells that do not contain valid data. FIG. 1 shows a conventional method of refreshing a DRAM. In this figure, signal WD, an output of a row decoder, is asserted high (i.e. becomes active or assumes a high state) whenever a refresh operation is performed, and RXN, another output of the row decoder, is also asserted high during the operation. Signal WD/ is a complement signal of signal WD. During refresh, signal WD, which is asserted high, passes through a transistor M1 and turns on a transistor M2, pulling up a signal WLN at a node X to a high voltage of the signal RXN as a transistor M3 is turned off by the signal WD/. The signal WLN, having an active high voltage, is then used as a wordline signal for activating the memory cells connected to this wordline. After each memory cell of the selected array is refreshed, the signal WD/ changes to high voltage while signal WD changes to low voltage, pulling the wordline signal WLN at the node X down to an inactive low voltage (Vss).

A few techniques are known which address this problem of wasting power when refreshing a DRAM. One method entitled "Method and apparatus for refreshing a selected portion of a dynamic random access memory" disclosed by Parks et. al. in U.S. Pat. No. 5,469,559 uses a random access memory (RAM) device to store region descriptors used to keep track of the memory cells with valid data and inhibit the refresh of the memory cells with invalid data. This method saves a lot of power, but, however at the expense of the system complexity.

U.S. Pat. No. 5,283,885 entitled "Storage module including a refresh device for storing start and stop refresh addresses" by Hollerbauer teaches the use of an additional storage device to store start addresses and stop addresses under the control of a control circuit, so that only the memory cells situated between a pair of the start and the stop addresses are timely refreshed. As is the case as the Parks et. al. patent, this method uses a lot of descriptors or indicators, complicating the whole memory system.

In U.S. Pat. No. 5,331,601 entitled "DRAM variable row select," the applicant thereof, Parris, uses an additional controller to alter the refresh address. Still, other methods use a controller to reallocate the valid data so that all the valid data are confined into one or a few blocks, and then are timely refreshed. Not only is an additional controller needed for these methods, but a lot of time is spent at moving the data when the amount of valid data becomes large.

SUMMARY OF THE INVENTION

A system of refreshing data stored in an array of memory cells is disclosed for selectively refreshing the memory rows each containing at least some, for example, a single bit of, valid data. The refresh system includes a latch circuit, where a reset signal is used to reset the latch circuit, and an input signal is fed to the latch circuit to change the state of the latch circuit. The refresh system also includes a circuit for generating a select signal connected to the input of the latch circuit. The refresh further includes a pass circuit for passing the refresh signal to generate a selective refresh signal, thereby refreshing one row of the memory cells which contains valid data. Furthermore, a circuit is used for controlling at least one bitline passing gate and sense amplifier for refreshing the data stored in the memory cells.

DESCRIPTION OF THE PREFERRED EMBODIMENT

Figure 1:
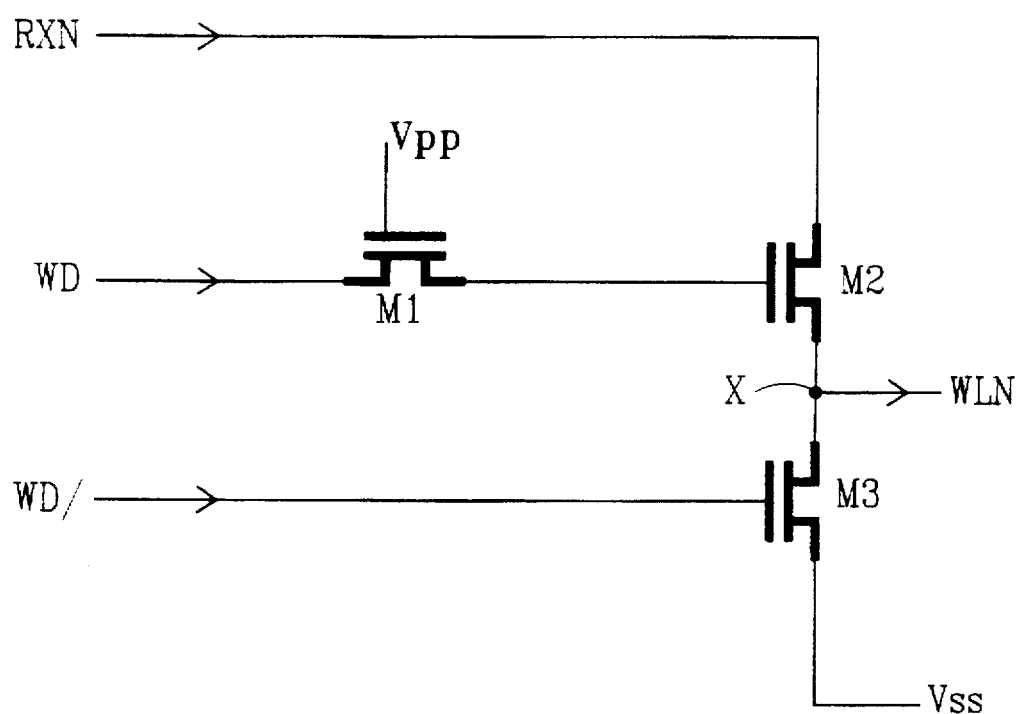
FIG. 1 shows a conventional circuit for refreshing a dynamic random access memory
Figure 2:
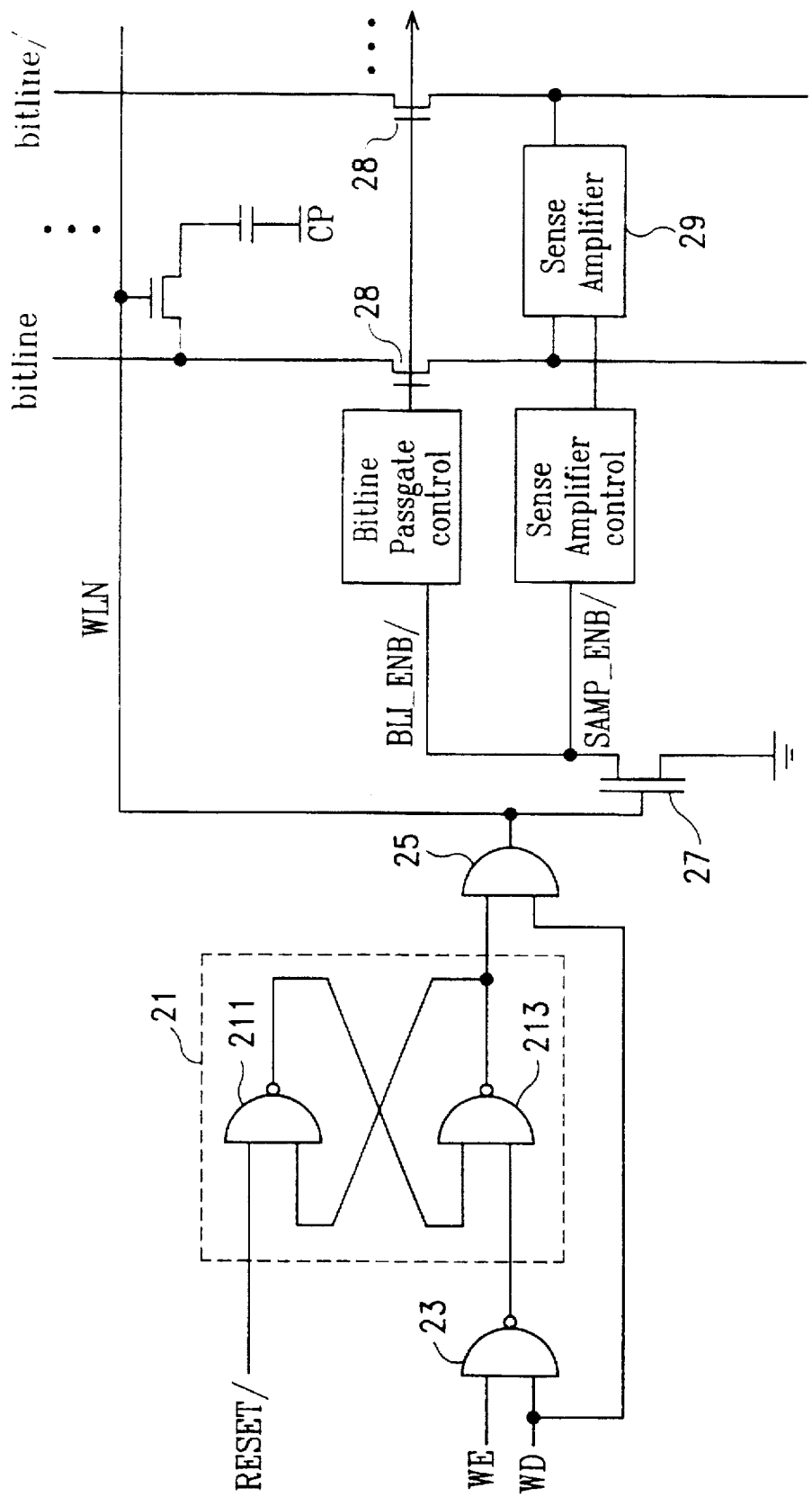
FIG. 2 shows one of the preferred embodiments according to the present invention.

FIG. 2 shows one of the preferred embodiments according to the present invention, where signal WD is a memory access signal, and signal WE is a write-related signal, which is asserted high whenever a write operation is performed. A latch circuit 21 implemented by NAND gates 211 and 213 is controlled by a signal RESET/. Those skilled in the art will appreciate the fact that other implementations of latch 21 may be substituted for the disclosed embodiment, if desired. As a power-on reset (which is usually implemented in hardware) or a master reset (implemented by software) is performed, signal RESET/ is low, forcing the output of gate 211 and one input of gate 213 high. Since there is no memory access during reset, signal WD is low, forcing the output of gate 23 or the other input of gate 213 high. The output of gate 213 is low due to the fact that both its inputs are high and thus latch circuit 21 is reset to its initial state. Since the output of the latch 21 is connected to one input of gate 25, any memory access including read or refresh is blocked by the gate 25 when latch 21 is reset to its initial state. Whenever both the signal WE and the signal WD are asserted active (which is high for both signal WE and signal WD), the resulting output generated by a gate 23 is active (it goes low in this embodiment), changing the state of the latch circuit 21 from its initial state to an excited state, which is high in this embodiment. The aforementioned output of the gate 23 is used as a select signal for deciding whether the latch should be changed to an excited state. Of course, other circuit designs may be used to implement the aforementioned functions of the gate 23. The output of the latch circuit 21 is then used as a control signal for controlling a passing gate 25. When this control signal is active, high in this embodiment, the feed forwarded signal WD passes through the passing gate 25, activating a wordline signal WLN. A circuit 27 preferably provided by a n-type metal oxide semiconductor (NMOS) transistor, is further used for enabling a few of bitline passing gates 28 and a few of sense amplifiers 29 by pulling down the bitline passing gate control signal BLI_ENB/ and the sense amplifier control signal SAMP_ENB/.

If no write operations have occurred since the last reset on the rows controlled by latch 21, then no valid data has be written to rows of the memory cells normally accessed by signal WD. Moreover, because no write operations have occurred since the last reset, the signal WD and the write signal WE have not become active simultaneously, and thus latch circuit 21 remains in its initial state until a write operation occurs. With latch 21 in its initial state, the access signal WD is inhibited from passing through passing gate 25 if a read or refresh is attempted. Thus the rows of memory cells which are normally accessed by signal WD are not read or refreshed if they do not contain valid data. Thus, the object of saving electrical power by not performing a refresh operation on those rows of memory cells containing no valid data is thus achieved.

Figure 3:
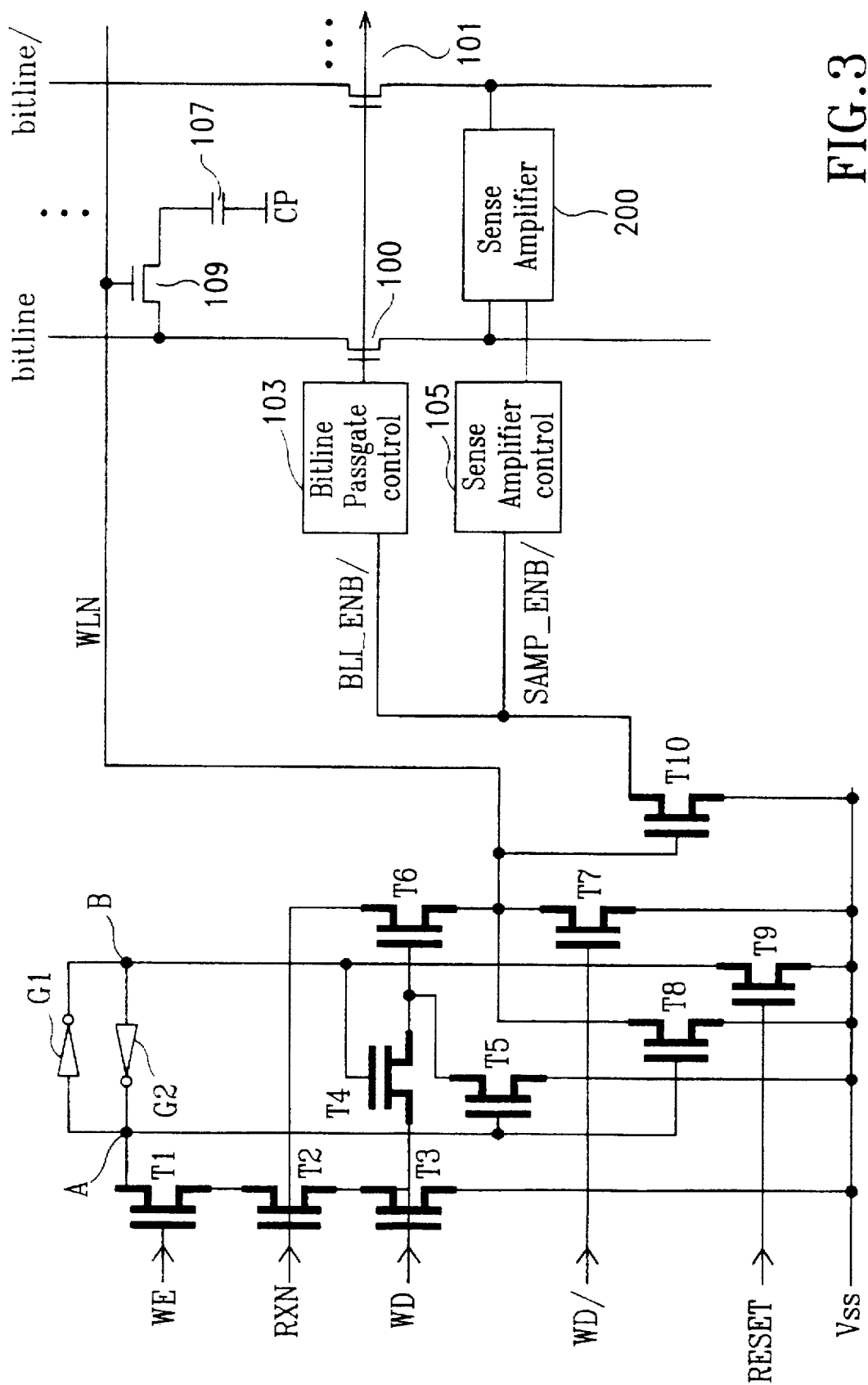
FIG. 3 shows another embodiment according to the present invention.

FIG. 3 shows another embodiment of the present invention. Comparing with the diagram of FIG. 2, the combination of gates G1, G2 and T9 in FIG. 3 act as the latch circuit 21 in FIG. 2. The transistors T1, T2 and T3 of FIG. 3 together act as gate 23 in FIG. 2. Transistors T4 through T8 in FIG. 3 together perform the function of passing gate 25 in FIG. 2. Further, transistor T10 in FIG. 3 behaves the same as transistor 27 in FIG. 2. Note that the signal names in FIG. 2 and FIG. 3 are different because of the implementation and polarity. Signal WE in FIG. 2 is the same as signal WE in FIG. 3. Signal WD/ in FIG. 3 is a complement signal of WD. Both RXN and WD are results of row decoding output.

Node B is initially reset by applying a high signal RESET at the transistor T9, pulling the voltage at node B down to Vss and making the voltage at node A high by the inverting action of gate G2. Since node A is high and node B is low, resulting transistor T5 to be on and transistor T4 to be off, forcing the gate of transistor T6 to be low, and transistor T6 is off. A high at node A forces transistor T8 to turn on, resulting a low at wordline WLN. Node B stays low and node A stays high even after reset or signal RESET is high due to the latch structure of G1 and G2.

If, after reset, there is an attempt to access memory cells on a wordline, the corresponding signals RXN and WD are high and signal WD/ is low. If the memory access is a read or refresh, signal WE is low, keeping transistor T1 to be off. There is no change in the latch and WLN stays low indicating memory access is ignored and preventing read or refresh operation on the rows of memory cells containing no valid data. If the memory access is a write, signal WE is high resulting transistor T1 to be on. Since transistor T2 and T3 of the pointed wordline are turned on by the corresponding signals RXN and WD, node A is pulled down to Vss through the transistors T1, T2 and T3, and node B is then asserted high by the inverting action of gate G1. As such, transistors T5 and T8 are turned off by a low at node A and transistor T4 is turned on by a high at node B allowing signal WD to turn on transistor T6. Since signal WD/ is a complement signal of WD, it is low turning of transistor T7. As transistor T6 is on and transistor T7 is off, a high at RXN passes through transistor T6 and drives WLN to a high accessing the memory cells on this wordline. A high of signal WLN turns on transistor T10 to activate bitline passgates and sense amplifiers for normal memory access operation. Following a first write to the designated wordline, the corresponding latch stays at excited state, allowing further memory access regardless of read, write or refresh until next reset.

Further referring to FIG. 3, BLI_ENB/ is a control signal to bitline passgate control block 103 which enables pass transistors 100 and 101, allowing the bitline and bitline/ signals to pass to the sense amplifier 200. SAMP_ENB/ is a control signal to sense amplifier control block 105 which enables sense amplifier 200. The sense amplifier 200, when enabled, magnifies the bitline and bitline/ signals and enhances the voltage at memory capacitor 107, which is connected to a constant-voltage cell plate (CP), while WLN is high, enabling transistor 109.

Although specific embodiments have been illustrated and described it will be obvious to those skilled in the art that various modification may be made without departing from the spirit which is intended to be limited solely by the appended claims. For example, the method and apparatus of the present invention can be applied to any memory system which requires a way to tell one row of memory cells containing at least one valid data from another row containing no valid data.

What is claimed is:

1. An apparatus for refreshing data stored in an array of memory cells, said apparatus comprising:

latch means, responsive to a reset signal and an input signal, for latching said input signal, said latch means being set to a first state by the reset signal;

select means, responsive to a write signal and a memory access signal, for generating the input signal of said latch means, said latch means being set to a second state when both the write signal and the memory access signal become active, the second state or said latch means remaining until said latch means is reset to its first state by the reset signal; and means for passing said memory access signal to refresh the data stored in the array of the memory cells when said latch means is in the second state.

2. The apparatus according to claim 1, further comprising bitline means responsive to said passed memory access signal for controlling at least a bitline passgate control circuit.

3. The apparatus according to claim 2, wherein said bitline means comprises a circuit for pulling a first control signal to the bitline passgate control circuit.

4. The apparatus according to claim 1, further comprising amplifier-sense means responsive to said passed memory access signal for controlling at least a sense amplifier control circuit.

5. The apparatus according to claim 4, wherein said amplifier-sense means comprises a circuit for pulling down a second control signal to the sense amplifier control circuit.

6. The apparatus according to claim 1, wherein said input signal becomes active when both said write signal and said memory access signal are active.

7. An apparatus for refreshing data stored in an array of memory cells, said apparatus comprising:

a latch circuit configured to receive a reset signal and an input signal, said latch circuit being set to a first state when the reset signal becomes active;

a select circuit configured to receive a write signal and a memory access signal, an output terminal of said select circuit being electrically connected to an input terminal of said latch circuit to provide the input signal of said latch circuit, said latch circuit being set to a second state when both the write signal and the memory access signal become active, the second state of said latch circuit remaining until said latch circuit is reset to its first state by the reset signal; and a passing circuit electrically connected to an output terminal of said latch circuit, and connected to receive the memory access signal, said memory access signal being passed through the passing circuit to refresh the data stored in the array of the memory cells when said latch circuit is in its second state.

8. The apparatus according to claim 7, further comprising means responsive to said passed memory access signal for pulling down a first control signal to at least a bitline passgate control circuit.

9. The apparatus according to claim 7, further comprising means responsive to said passed memory access signal for pulling down a second control signal to at least a sense amplifier control circuit.

10. A method of refreshing data stored in an array of memory cells, said array being arranged in subsets of memory cells for which writing of data to the cells in the subset is controlled by a write signal, said method comprising the steps of:

communicating a memory access signal to the cells of an associated subset as a function of the state of a latch circuit, wherein the memory access signal is communicated to the cells when the latch circuit is in a first state, and the memory access signal is inhibited from communicating to the cells when the latch circuit is in a second state;

setting said latch circuit to its second state when both the write signal and the memory access signal become active, the second state of said latch circuit remaining until said latch circuit is reset to its first state; and refreshing the cells using the memory access signal, the cells being refreshed only when the latch circuit is in the second state.

* * * * *